United States Patent
Rahafrooz et al.

(10) Patent No.: US 12,388,411 B2
(45) Date of Patent: Aug. 12, 2025

(54) SINGLE ANCHOR RESONATORS

(71) Applicant: Panasonic Intellectual Property Management Co., Ltd., Osaka (JP)

(72) Inventors: Amir Rahafrooz, Shaker Heights, OH (US); Diego Emilio Serrano, Alpharetta, GA (US); Thomas Kieran Nunan, Carlisle, MA (US); Ijaz Jafri, Holliston, MA (US)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 363 days.

(21) Appl. No.: 18/061,252

(22) Filed: Dec. 2, 2022

(65) Prior Publication Data

US 2024/0186976 A1 Jun. 6, 2024

(51) Int. Cl.
*H03H 9/02* (2006.01)
*H03H 9/24* (2006.01)

(52) U.S. Cl.
CPC ...... *H03H 9/02433* (2013.01); *H03H 9/2405* (2013.01); *H03H 2009/0244* (2013.01); *H03H 2009/2442* (2013.01)

(58) Field of Classification Search
CPC ............. H03H 9/02433; H03H 9/2405; H03H 2009/0244; H03H 2009/2442; H03H 2009/02503
USPC .................................................. 310/309, 310
See application file for complete search history.

(56) References Cited

U.S. PATENT DOCUMENTS

| | | | |
|---|---|---|---|
| 8,324,986 B2 | 12/2012 | Lutz et al. | |
| 8,786,166 B2 | 7/2014 | Jaakkola et al. | |
| 10,367,469 B2 | 7/2019 | Kaajakari | |
| 2007/0072327 A1* | 3/2007 | Weigold | B81C 1/00246 438/50 |
| 2012/0038431 A1 | 2/2012 | Jaakkola et al. | |

(Continued)

FOREIGN PATENT DOCUMENTS

| | | |
|---|---|---|
| JP | 2006-203742 A | 8/2006 |
| JP | 2008-211363 A | 9/2008 |
| WO | 2021/209682 A2 | 10/2021 |

OTHER PUBLICATIONS

International Search Report of PCT application No. PCT/JP2023/029911 dated Oct. 31, 2023.

(Continued)

*Primary Examiner* — Ahmed Elnakib
(74) *Attorney, Agent, or Firm* — McDonald Hopkins LLC (57) ABSTRACT

A mechanical resonator includes two identical plates, and a decoupling structure comprising at least two first connectors, each first connector connecting the decoupling structure to a respective one of the two identical plates, and an anchor disposed at a center of the decoupling structure. Each of the two identical plates may be a square plate adapted to resonate in Lamé-mode. Further, each of the two identical plates may comprise a plurality of square plates, each square plate disposed next to one another. The decoupling structure further comprises a first ring connected to each of the two identical plates via a respective one of the at least two first connectors. The decoupling structure may further comprise a second ring connected to an inside of the first ring via at least two second connectors, wherein the anchor is disposed at a center of the second ring.

14 Claims, 5 Drawing Sheets

(56) References Cited

U.S. PATENT DOCUMENTS

| | | | |
|---|---|---|---|
| 2012/0227487 A1* | 9/2012 | Ayazi | G01C 19/56 216/6 |
| 2014/0361844 A1* | 12/2014 | Quevy | H03L 1/04 331/70 |
| 2016/0038431 A1* | 2/2016 | Venkatesh | A61P 21/02 424/490 |
| 2016/0327390 A1* | 11/2016 | Serrano | G01C 19/5698 |
| 2019/0222196 A1 | 7/2019 | Daruwalla et al. | |
| 2019/0227034 A1* | 7/2019 | Li | H03B 5/30 |
| 2020/0067479 A1* | 2/2020 | Ikehashi | H03H 9/2431 |
| 2022/0107181 A1* | 4/2022 | Rahafrooz | G01C 19/5755 |
| 2023/0133733 A1* | 5/2023 | Saarela | H03H 9/2431 333/186 |
| 2024/0186975 A1* | 6/2024 | Rahafrooz | H03H 9/2405 |
| 2024/0186976 A1* | 6/2024 | Rahafrooz | H03H 9/2405 |

OTHER PUBLICATIONS

J. Rodriguez et al., "Direct Detection of Akhiezer Damping in a Silicon MEMS Resonator", Scientific Reports, vol. 9, Feb. 19, 2019, pp. 1-10, https://doi.org/10.1038/s41598-019-38847-6.

J. E.-Y. Lee et al., "A Single-Crystal-Silicon Bulk-Acoustic-Mode Microresonator Oscillator", IEEE Electron Device Letters, vol. 29, No. 7, pp. 701-703, Jul. 2008, doi: 10.1109/LED.2008.2000643.

V. Thakar et al., "Optimization of tether geometry to achieve low anchor loss in Lamé-mode resonators", 2013 Joint European Frequency and Time Forum & International Frequency Control Symposium (EFTF/IFC), 2013, pp. 129-132, doi: 10.1109/EFTF-IFC.2013.6702174.

G. D. Vukasin et al., "Anchor Design Affects Dominant Energy Loss Mechanism in a Lamé Mode MEM Resonator", Journal of Microelectromechanical Systems, vol. 29, No. 5, pp. 860-866, Oct. 2020, doi: 10.1109/JMEMS.2020.3012925.

"Perfectly matched layer", Wikipedia, Oct. 23, 2022, https://en.wikipedia.org/wiki/Perfectly_matched_layer.

* cited by examiner

SINGLE ANCHOR RESONATORS

TECHNICAL FIELD

The present disclosure relates to bulk acoustic width (BAW) mode (e.g., Lamé mode) resonators with less anchor loss. In particular, the resonators include two identical plates and a decoupling structure therebetween. Each of the two identical plates may comprise a plurality of square plates, each square plate disposed next to one another.

BACKGROUND

Resonators are popular and widely being used for different applications, but they have relatively high anchor loss which degrades their quality factor. As the resonator is vibrating, part of the acoustic energy leaks into the substrate and gets dissipated.

Anchor loss can impact the resonator in several ways. First, it can reduce the overall quality factor of the resonator, and it can make a quality factor of the resonator dependent on substrate boundary conditions and stress. Second, the anchor loss makes the resonator susceptible to repeatability and hysteresis issues.

There has been extensive effort to reduce anchor loss by either making changes to the anchor(s) or the resonant body and/or even the substrate. However, there are still some highly popular resonators that may not have low enough anchor loss.

Hence, there is a need for the technique for reducing anchor losses in mechanical resonators.

SUMMARY

The present disclosure provides the mechanical resonators designed to reduce the anchor losses during the BAW mode (e.g., Lamé mode).

In one aspect, a mechanical resonator includes two identical plates, and a decoupling structure comprising at least two first connectors, each first connector connecting the decoupling structure to a respective one of the two identical plates, and an anchor disposed at a center of the decoupling structure.

In one embodiment, the decoupling structure further comprises a first ring connected to each of the two identical plates via a respective one of the at least two first connectors.

The decoupling structure may further comprise a second ring connected to an inside of the first ring via at least two second connectors, wherein the anchor is disposed at a center of the second ring.

Also, the first ring may have a first rectangular ring shape, and the second ring may have a second rectangular ring shape, the first rectangular ring shape being larger than the second rectangular ring shape.

The two identical plates may be two identical proof-mass plates.

Specifically, each of the two identical plates may be a square plate adapted to resonate in Lamé-mode.

Further, each of the two identical plates may comprise a plurality of square plates, each square plate disposed next to one another.

In another embodiments, each of the two identical plates may comprise two square plates disposed next to each other in line with the decoupling structure.

Each of the two identical plates may comprise three square plates disposed next to one another in a row.

In one example, the two identical plates may comprise an upper plate comprising six square plates, arranged three-by-two square plates, and a lower plate comprising six square plates, arranged three-by-two square plates.

In another example, the decoupling structure may be connected to both corners of a square plate located in a middle and inside of three-by-two square plates of the upper plate, and both corners of a square plate located in a middle and inside of three-by-two square plates of the lower plate.

In yet another example, the decoupling structure may be connected to one outer corner of a square plate located in a left side and inside of the three-by-two square plates of the upper plate, one outer corner of a square plate located in a right side and inside of the three-by-two square plates of the upper plate, one outer corner of a square plate located in a left side and inside of the three-by-two square plates of the lower plate, and one outer corner of a square plate located in a right side and inside of the three-by-two square plates of the lower plate.

In a different example, the two identical plates may comprise an upper plate comprising four square plates including two square plates in a middle and one square plate in a right side and one square plate in a left side thereof, and a lower plate comprising four square plates including two square plates in a middle and one square plate in a right side and one square plate in a left side thereof.

Alternatively, the two identical plates may comprise an upper plate comprising four square plates including one square plate in a middle and two square plates in a right side and two square plates in a left side thereof, and a lower plate comprising four square plates including one square plates in a middle and two square plates in a right side and two square plates in a left side thereof.

Further, each of the two identical plates include at least one release perforation thereon.

Furthermore, a portion of the plurality of resonating plates is capacitively actuated into the Lamé resonance mode.

In one embodiment, the single anchor may include two or more sub-anchors.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, coupled to or with, be communicable with, cooperate with, interleave, juxtapose, be proximate to, be bound to or with, have, have a property of, or the like. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

FIGS. 1A through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system and method. The following description with reference to the accompanying drawings is provided to assist in a comprehensive understanding of various embodiments of the present disclosure as defined by the claims and their equivalents. It includes various specific details to assist in that understanding but these are to be regarded as mere examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

It should be apparent to those skilled in the art that the following description of various embodiments of the present disclosure is provided for illustration purpose only and not for the purpose of limiting the present disclosure as defined by the appended claims and their equivalents.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or a combination thereof, but do not preclude the presence or addition of one or more other features, numbers, steps, operations, components, elements, or combinations thereof.

Figure 1A:
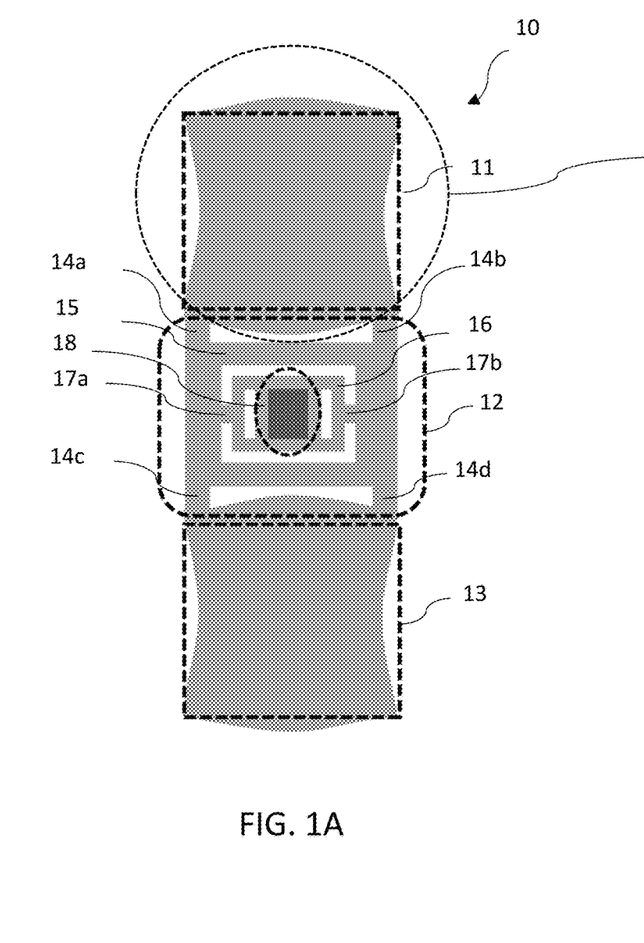
FIGS. 1A to 1C illustrate example schematic diagrams of a mechanical resonator according to embodiments of the present disclosure.

FIG. 1A illustrates an example schematic diagram of mechanical resonator vibrating 10 in Lamé mode according to embodiments of the present disclosure. Lamé mode resonance is a combination of two shear waves, and it is known to exist in several crystal orientations of silicon.

As illustrated, mechanical resonator 10 includes resonance plates 11, 13 and decoupling structure 12 disposed between resonance plates 11, 13. Resonance plates 11, 13 and decoupling structure 12 may be etched out from a substrate; for example, a substrate with silicon, doped silicon, N-type silicon, P-type silicon, silicon oxide, silicon carbide, germanium, or the like. Each of resonance plates 11, 13 has a shape of a square with a length L of each side.

Two resonance plates 11, 13 are two identical proofmasses in various sizes, for example, between a 10 μm×10 μm square and 1 mm×1 mm square.

Decoupling structure 12 includes four outer connectors 14a to 14d, outer ring 15, two inner connectors 17a, 17b, inner ring 16, and anchor 18. Four outer connectors 14a to 14d connect outer ring 15 to resonance plates 11, 13 vertically, and two inner connectors 17a, 17b connect inner ring 16 to outer ring 15 horizontally.

Anchor 18 is disposed at the center of inner ring 16 horizontally. Anchor 18 can be etched into a substrate made of various materials, such as N or P-type silicon, silicon oxide, silicon carbide, germanium, or the like.

The horizontal and vertical directions in this disclosure are relative directions, and may be switched with each other according to a viewpoint.

Each of resonance plates 11, 13 includes at least two electrodes for applying resonance signals to vertical and horizontal sides of the plates. As resonance plates 11, 13 vibrate according to the resonance signals, acoustic energy leaking from each of two resonance plates 11, 13 into decoupling structure 12 are in an equal magnitude but opposite in direction, and thus cancel each other out at anchors 18. Thus, the center of the connecting beam is a good place to anchor the resonator 20 because anchor loss can be minimized due to the cancellation of each acoustic energy leaking from two resonance plates 11, 13.

Figure 1B:
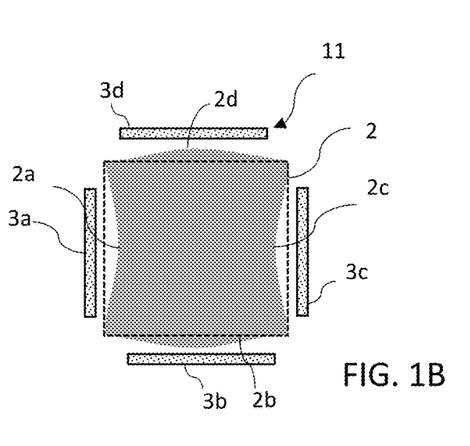

FIG. 1B illustrates an enlarged view of one resonance plate 11 vibrating in the Lamé mode resonance according to embodiments of the present disclosure.

As illustrated, each of resonance plates 11, 13 is capacitively actuated into a Lamé resonance mode by means of electrodes disposed along the sides of the resonance plate. Specifically, electrodes 3a, 3c, which are disposed along both vertical sides of resonance plate 11, are connected to a first actuating signal potential and; and electrodes 3b, 3d, which are disposed along both horizontal sides of resonance plate 11, are connected to a second actuating signal potential. The gap between the electrodes and the resonance plates may be narrow enough to provide a good coupling for actuation, such as less than 200 nm.

The first and second actuating signal potentials may be alternating signals with 180 degrees phase difference from each other. The resonance plate is electrically conductive, and the alternating actuation signals actuates an oscillation of Lamé mode in the resonance plate.

As illustrated, dashed line 2 indicates the oscillation phase 0° or 180°, in which the sides of the resonance plate 11 are in a rest position. Sides 2b, 2d are convex, indicating the oscillation phase of 90°, while sides 2a, 2c are concave, indicating the oscillation phase of 270°. The resonance plate maintains the same volume in all instants of oscillation of the Lamé resonance mode.

The above electrode arrangements may be applied to each and every one of the resonance plates in the mechanical resonators described in this disclosure. It is also possible to use only two electrodes for each resonance plate, one for a vertical side and the other for a horizontal side of a resonance plate, instead of four electrodes.

Figure 1C:
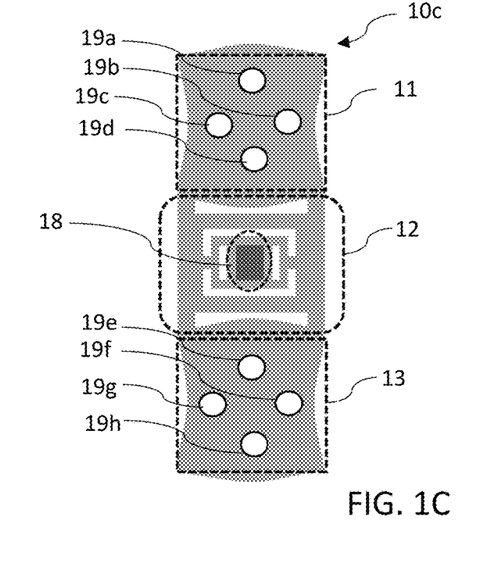

FIG. 1C illustrates another example schematic diagram of mechanical resonator 10c according to embodiments of the present disclosure. Mechanical resonator 10c additionally includes release perforations 19a to 19h on resonance plates 11 and 13, as compared to mechanical resonator 10. The repetitive descriptions of the same components are omitted for brevity.

Figure 2:
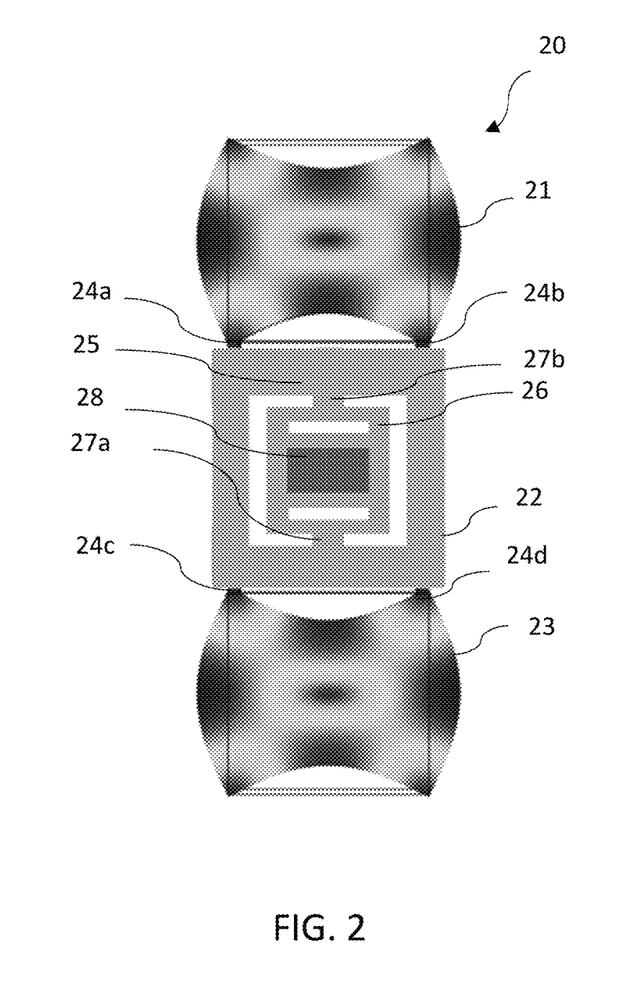
FIG. 2 illustrates another example schematic diagram of a mechanical resonator according to one embodiment of the present disclosure.

FIG. 2 illustrates an example image of the vibrating mechanical resonator 20 according to one embodiment of the present disclosure.

Similar to FIG. 1A, mechanical resonator 20 includes identical resonance plates 21, 23 and decoupling structure 22 disposed between resonance plates 21, 23. The repetitive descriptions of the same components will be omitted for brevity.

Decoupling structure 22 may have various shapes with a single anchor. As an example, decoupling structure 22 includes four outer connectors 24a to 24d, outer ring 25, two inner connectors 27a, 27b, inner ring 26, and anchor 28. Specifically, two outer connectors 24a, 24b connect outer ring 25 to resonance plate 21 vertically, and two outer connectors 24c, 24d connect outer ring 25 to resonance plate 23 vertically. Two inner connectors 27a, 27b connect inner ring 26 to outer ring 25 vertically. Anchor 28 is disposed at the center of inner ring 16 horizontally.

Figure 3:
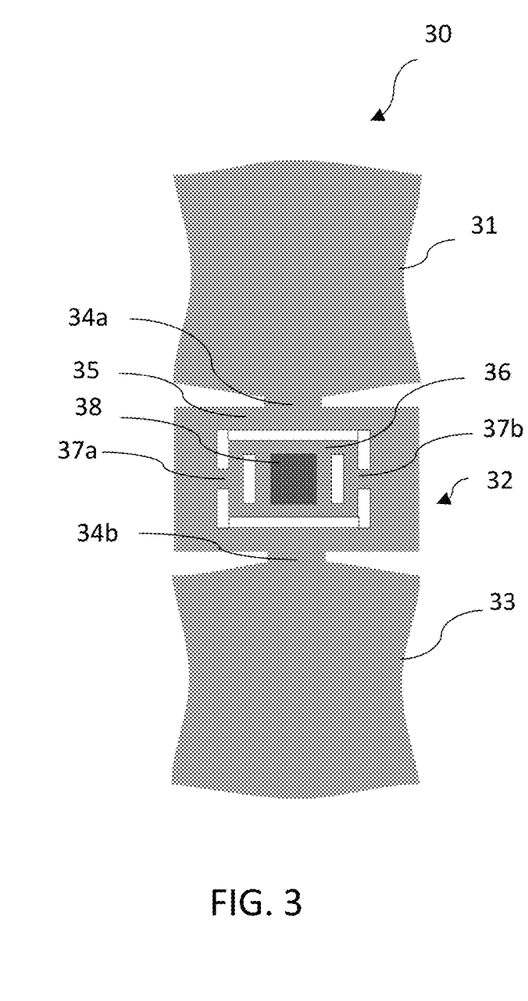
FIG. 3 illustrates yet another example schematic diagram of a mechanical resonator according to one embodiment of the present disclosure.

FIG. 3 illustrates another example schematic diagram of a mechanical resonator 30 according to one embodiment of the present disclosure.

Similar to FIG. 1A, mechanical resonator 30 includes resonance plates 31, 33 and decoupling structure 32 disposed between resonance plates 31, 33. The repetitive descriptions of the same components will be omitted for brevity.

In this embodiment, decoupling structure 32 includes two outer connectors 34a, 34b for connecting outer ring 35 to resonance plates 31, 33, instead of the four outer connectors 14a to 14d illustrated in FIG. 1A. Specifically, outer connector 34a connects one side of outer ring 35 to the middle of resonance plate 31, and outer connector 34b connects the opposite side of outer ring 35 to the middle of resonance plate 33.

Two inner connectors 37a, 37b connect inner ring 36 to outer ring 35 horizontally, and anchor 38 is disposed at the center of inner ring 36 vertically.

FIGS. 4-10 illustrate mechanical resonators with extended resonance plates which include a plurality of square plates, each square plate disposed next to one another.

Figure 4:
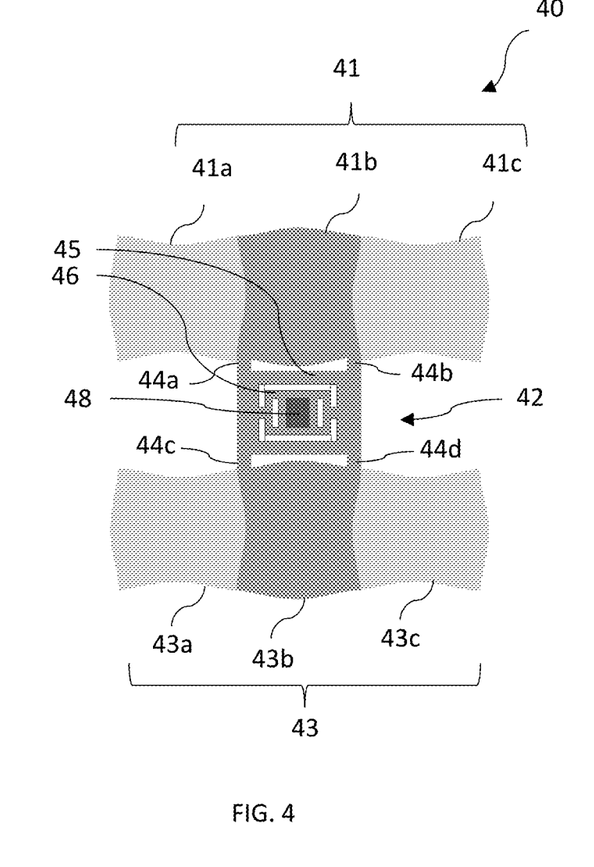
FIG. 4 illustrates an example schematic diagram of a mechanical resonator with horizontally extended resonance plates according to one embodiment of the present disclosure.

FIG. 4 illustrates an example schematic diagram of mechanical resonator 40 with horizontally extended resonance plates, according to one embodiment of the present disclosure.

Mechanical resonator 40 includes upper extended resonance plate 41 and lower extended resonant 43 and decoupling structure 42 disposed between upper and lower extended resonance plates 41, 43.

In this embodiment, upper extended resonance plate 41 comprises three resonating plates 41a to 41c arranged in a row, and lower extended resonance plate 43 comprises three resonating plates 43a to 43c arranged in a row. One or more of resonating plates 41a to 41c, 43a to 43c is capacitively actuated into a Lamé resonance mode by means of electrodes (not shown) disposed along the sides of the resonance plate, as described above.

Decoupling structure 42 may have various shapes with an anchor. As an example, decoupling structure 42 may include four outer connectors 44a to 44d, outer ring 45, two inner connectors 47a, 47b, inner ring 46, and anchor 48. Specifically, two outer connectors 44a, 44b connect outer ring 45 to resonance plate 41b, and two outer connectors 44c, 44d connect outer ring 45 to resonance plates 43b. Two inner connectors 47a, 47b connect inner ring 46 to outer ring 45. Anchor 48 is disposed at the center of inner ring 46.

Figure 5:
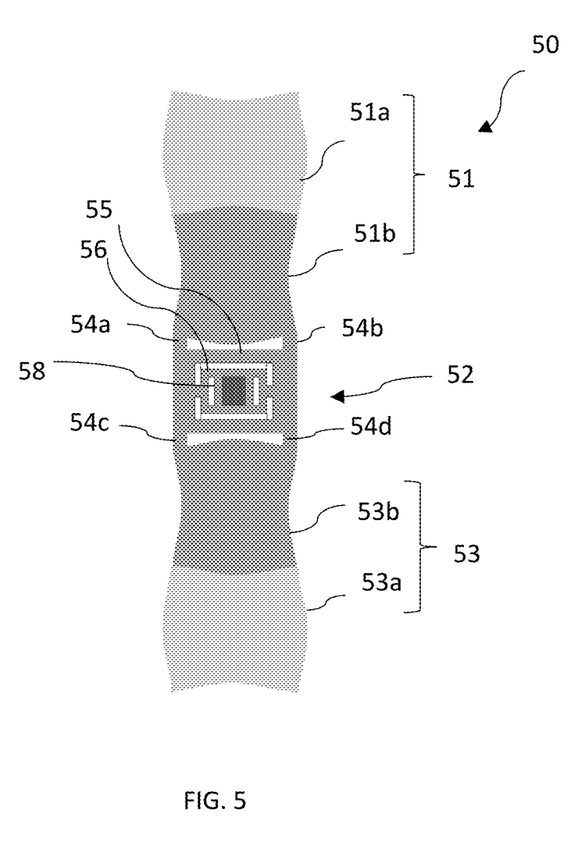
FIG. 5 illustrates another example schematic diagram of a mechanical resonator with vertically extended resonance plates according to one embodiment of the present disclosure.

FIG. 5 illustrates another example schematic diagram of a mechanical resonator 50 with vertically extended resonance plates, according to one embodiment of the present disclosure.

Mechanical resonator 50 includes extended upper plate 51 and extended lower plate 53 and decoupling structure 52 disposed between extended upper and lower plates 51, 53.

Specifically, extended resonance plate 51 comprises two resonating plates 51a, 51b arranged in parallel, and extended resonance plate 43 comprises three resonating plates 53a, 53b arranged in the vertical direction. One or more of resonating plates 51a, 51b and 53a, 53b may be capacitively actuated into a Lamé resonance mode by means of electrodes disposed along the sides of the resonance plate, as described above. The resonating plates are well connected to one another, so actuating only a portion of the resonating plates results in actuating the whole resonating plates.

Also, two outer connectors 54a, 54b connect outer ring 55 to resonance plate 51b, and two outer connectors 54c, 54d connect outer ring 55 to resonance plates 53b. Two inner connectors 57a, 57b connect inner ring 56 to outer ring 55. Anchor 58 is disposed at the center of inner ring 56.

Figure 6:
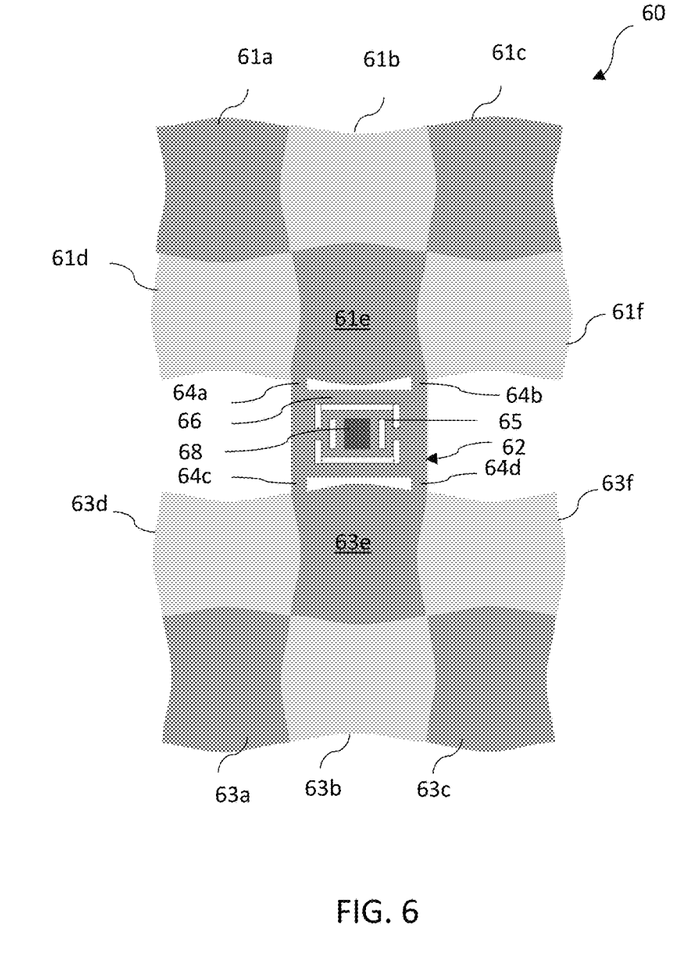
FIG. 6 illustrates an example schematic diagram of a mechanical resonator with upper and lower resonance plates extended in two rows according to one embodiment of the present disclosure.

FIG. 6 illustrates an example schematic diagram of a mechanical resonator 60 with upper and lower resonance plates extended in two rows, according to one embodiment of the present disclosure.

Mechanical resonator 60 includes upper extended resonance plate 61 and lower extended resonance plate 63, and decoupling structure 62 disposed between upper and lower extended resonance plates 61, 63.

Specifically, upper extended resonance plate 61 comprises six resonating plates 61a to 61f arranged in three-by-two square plates, and lower extended resonance plate 63 comprises six resonating plates 63a to 63f arranged in three-by-two square plates. One or more of resonating plates 61a to 61f, 63a to 63f may be capacitively actuated into a Lamé resonance mode by means of electrodes (not shown) disposed along the sides of the resonance plate, as described above.

Decoupling structure 62 may have various shapes with a single anchor. As an example, two outer connectors 64a, 64b of outer ring 65 are connected to both corners of resonant plate 61b located in the middle and inside of upper three-by-two square plates. Also, two outer connectors 64c, 64d of outer ring 65 are connected to both corners of resonant plate 63b located in the middle and inside of the lower three-by-two square plates. Anchor 68 is disposed at the center of inner ring 66.

Figure 7:
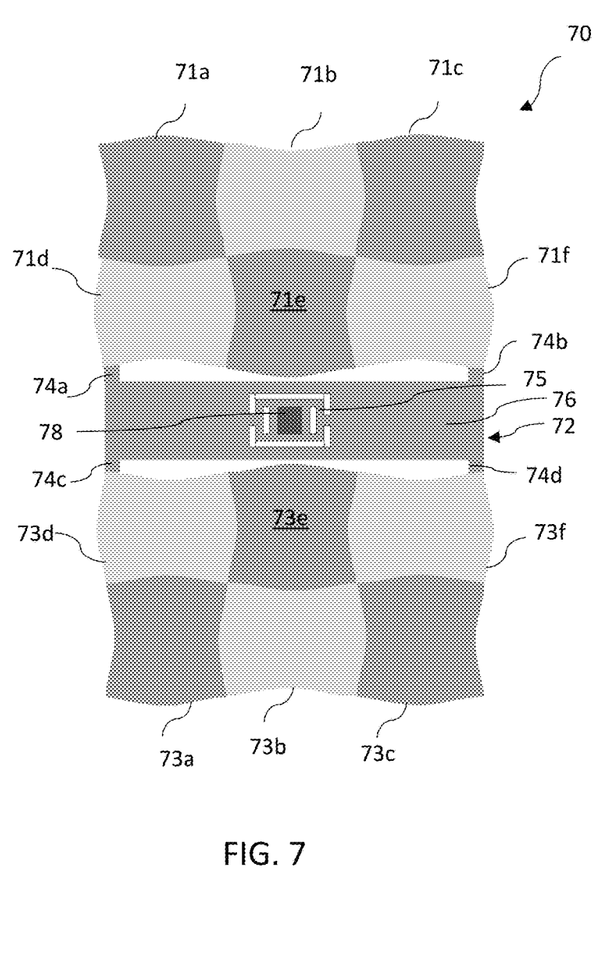
FIG. 7 illustrates another example schematic diagram of a mechanical resonator with upper and lower resonance plates extended in two rows according to one embodiment of the present disclosure.

FIG. 7 illustrates still another example schematic diagram of a mechanical resonator 70 with upper and lower resonance plates extended in two rows according to one embodiment of the present disclosure.

Similar to FIG. 6, mechanical resonator 70 includes upper extended resonance plate 71 and lower extended resonance plate 73, and decoupling structure 72 disposed between upper and lower extended resonance plates 71, 73.

Specifically, upper extended resonance plate 71 comprises six resonating plates 71a to 71f arranged in three-by-two square plates, and lower extended resonance plate 73 comprises six resonating plates 73a to 73f arranged in three-by-two square plates. One or more of resonating plates 71a to 71f, 73a to 73f is capacitively actuated into a Lamé resonance mode by means of electrodes (not shown) disposed along the sides of the resonance plate, as described above.

Decoupling structure 72 may have various shapes with a single anchor. As an example, connector 74a is connected to one outer corner of resonant plate 71d located in the left side and inside of the upper three-by-two square plates; connector 74b is connected to one outer corner of resonant plate 71f located in the right side and inside of the upper three-by-two square plates; connector 74c is connected to one outer corner of resonant plate 73d located in the left side and inside of the lower three-by-two square plates; and connector 74d is connected to one outer corner of resonant plate 73f located in the right side and inside of the lower three-by-two square plates.

Figure 8:
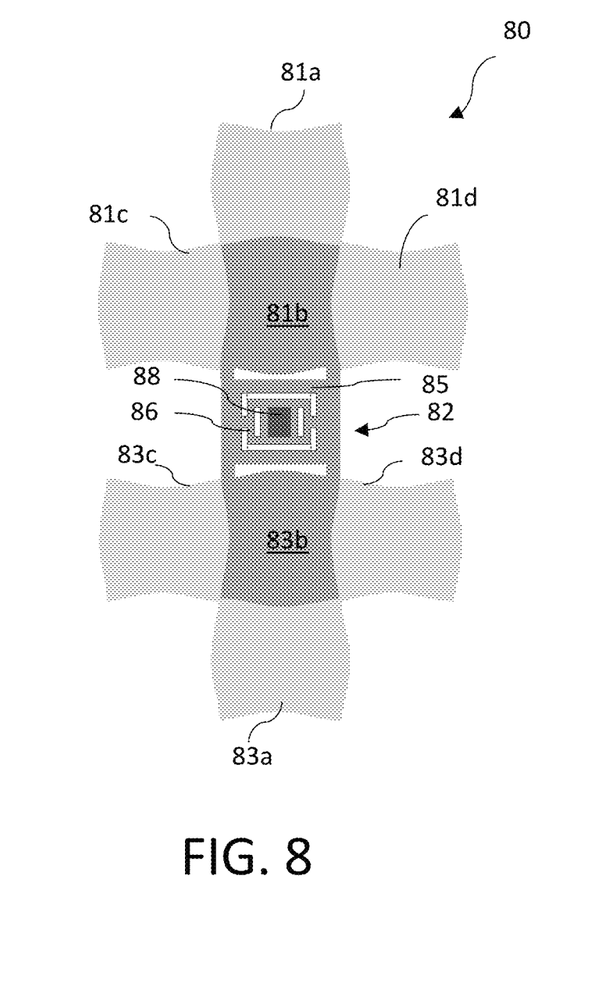
FIG. 8 illustrates another example schematic diagram of a mechanical resonator with "T" shape extended resonance plates according to one embodiment of the present disclosure.

FIG. 8 illustrates still another example schematic diagram of a mechanical resonator 80 with "T" shape extended resonance plates according to one embodiment of the present disclosure.

Mechanical resonator 80 includes upper extended resonance plate 81 and lower extended resonance plate 83, and decoupling structure 82 disposed between upper and lower extended resonance plates 81, 83.

Specifically, upper extended resonance plate 81 comprises four resonating plates 81a to 81d: two resonance plates 81a, 81d in the middle and one resonance plate 81c in a left side and one resonance plate 81d in a right side thereof.

Similarly, lower extended resonance plate 83 comprises four resonating plates 83a to 83d: two resonance plates 83a, 83d in the middle and one resonance plate 83c in a left side and one resonance plate 83d in a right side thereof. One or more of resonating plates may be capacitively actuated into a Lamé resonance mode by means of electrodes (not shown) disposed along the sides of the resonance plate, as described above.

Decoupling structure 82 may have various shapes with a single anchor. As an example, decoupling structure 22 includes outer ring 85 connected to both corners of resonance plate 81b and to both corners of resonance plate 83b, and inner ring 86 disposed inside outer ring 85. Anchor 88 is disposed at the center of inner ring 86.

Figure 9:
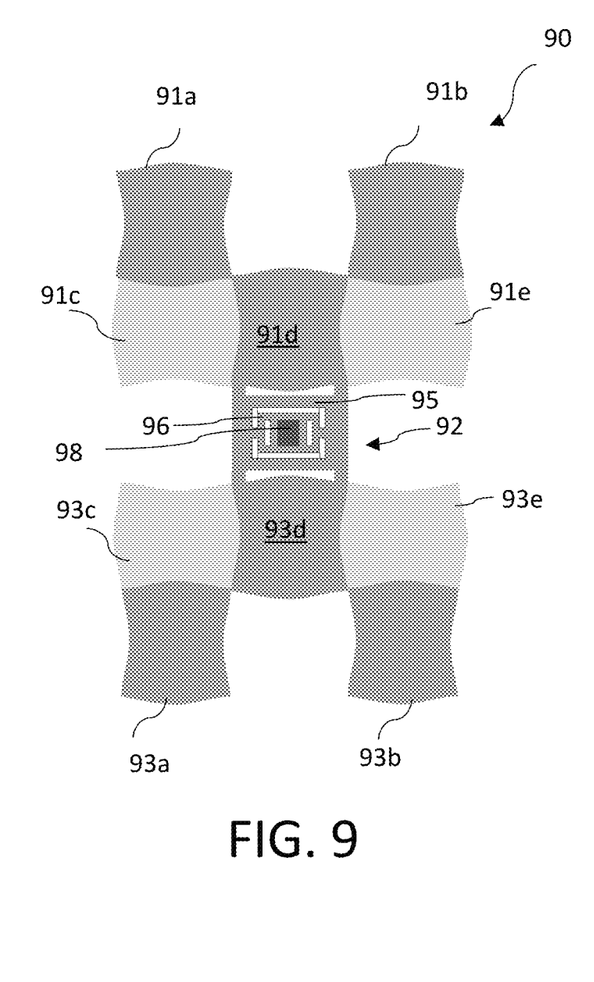
FIG. 9 illustrates an example schematic diagram of a mechanical resonator with "U" shape extended resonance plates according to one embodiment of the present disclosure.

FIG. 9 illustrates still another example schematic diagram of a mechanical resonator 70 with "U" shape extended resonance plates according to one embodiment of the present disclosure.

Mechanical resonator 90 includes upper extended resonance plate 91 and lower extended resonance plate 93, and decoupling structure 92 disposed between upper and lower extended resonance plates 91, 93.

Specifically, upper extended resonance plate 91 comprises four resonating plates 91a to 91e: one resonant plate 91d in the middle and two resonant plates 91a, 91c in a left side and two resonant plates 91b, 91e in a left side thereof. Lower extended resonant plate 93 comprises four resonating plates 93a to 93e: one resonant plate 93d in the middle and two resonant plates 93a, 93c in a left side and two resonant plates 93b, 93e in a left side thereof. One or more of resonating plates may be capacitively actuated into a Lamé resonance mode by means of electrodes (not shown) disposed along the sides of the resonance plate, as described above.

Decoupling structure 92 may have various shapes with a single anchor. As an example, decoupling structure 92 includes outer ring 95 connected to both inner corners of resonant plate 91d and to both inner corners of resonant plate 93d, and inner ring 96 disposed inside outer ring 95. Anchor 88 is disposed at the center of inner ring 86.

The above mechanical resonators may be proof-mass resonators made of a single semiconductor material (e.g., a single crystalline-silicon) vibrating in their bulk acoustic width/length extensional mode. These resonators can function in the first extensional mode or any of the higher modes. Such resonators made of silicon are called Silicon Bulk Acoustic Wave Resonator (SiBAR).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A mechanical resonator comprising:
   two identical plates; and
   a decoupling structure comprising:
   at least two first connectors, each first connector being connected to a respective one of the two identical plates;
   an anchor disposed at a center of the decoupling structure;
   a first ring connected to each of the two identical plates via a respective one of the at least two first connectors; and
   a second ring connected to an inside of the first ring via at least two second connectors, wherein the anchor is disposed at a center of the second ring.

2. The mechanical resonator according to claim 1, wherein the first ring has a first rectangular ring shape, and the second ring has a second rectangular ring shape, the first rectangular ring shape being larger than the second rectangular ring shape.

3. The mechanical resonator according to claim 1, wherein the two identical plates are two identical proof-mass plates.

4. The mechanical resonator according to claim 1, wherein each of the two identical plates is a square plate adapted to resonate in Lamé-mode.

5. The mechanical resonator according to claim 1, wherein each of the two identical plates comprises a plurality of square plates, each square plate disposed next to one another.

6. The mechanical resonator according to claim 5, wherein
a portion of the plurality of square plates is capacitively actuated into a Lamé resonance mode.

7. The mechanical resonator according to claim 1, wherein each of the two identical plates comprises two square plates disposed next to each other in line with the decoupling structure.

8. The mechanical resonator according to claim 1, wherein each of the two identical plates comprises three square plates disposed next to one another in a row.

9. The mechanical resonator according to claim 1, wherein the two identical plates comprise:
an upper plate comprising six square plates, arranged as three-by-two square plates; and
a lower plate comprising six square plates, arranged as three-by-two square plates.

10. The mechanical resonator according to claim 9, wherein the decoupling structure is connected to:
both corners of a square plate located in a middle and inside of three-by-two square plates of the upper plate; and
both corners of a square plate located in a middle and inside of three-by-two square plates of the lower plate.

11. The mechanical resonator according to claim 10, wherein the decoupling structure is connected to:
one outer corner of a square plate located in a left side and inside of the three-by-two square plates of the upper plate;
one outer corner of a square plate located in a right side and inside of the three-by-two square plates of the upper plate;
one outer corner of a square plate located in a left side and inside of the three-by-two square plates of the lower plate; and
one outer corner of a square plate located in a right side and inside of the three-by-two square plates of the lower plate.

12. The mechanical resonator according to claim 9, wherein the two identical plates comprise:
an upper plate comprising four square plates including two square plates in a middle and one square plate in a right side and one square plate in a left side thereof, and
a lower plate comprising four square plates including two square plates in a middle and one square plate in a right side and one square plate in a left side thereof.

13. The mechanical resonator according to claim 9, wherein the two identical plates comprise:
an upper plate comprising four square plates including one square plate in a middle and two square plates in a right side and two square plates in a left side thereof; and
a lower plate comprising four square plates including one square plates in a middle and two square plates in a right side and two square plates in a left side thereof.

14. The mechanical resonator according to claim 1, wherein each of the two identical plates include at least one release perforation thereon.

* * * * *